United States Patent [19]
Clements

[11] Patent Number: 5,963,681
[45] Date of Patent: Oct. 5, 1999

[54] CIRCUIT BOARD GUIDE AND LIGHT CONDUIT

[75] Inventor: Brad E. Clements, Fort Collins, Colo.

[73] Assignee: Hewlett-Packard Company, Palo Alto, Calif.

[21] Appl. No.: 08/920,397

[22] Filed: Aug. 29, 1997

[51] Int. Cl.[6] .................................................. G02B 6/26
[52] U.S. Cl. ........................... 385/14; 385/134; 385/901
[58] Field of Search ........................... 385/14, 134, 901; 362/555, 558, 559, 560, 561

[56] References Cited

U.S. PATENT DOCUMENTS

| | | | |
|---|---|---|---|
| 4,007,403 | 2/1977 | Fiege | 317/101 DH |
| 4,542,441 | 9/1985 | Perretta | 361/412 |
| 4,759,603 | 7/1988 | Jones | 350/96.28 |
| 5,055,061 | 10/1991 | Lichtenwalter | 439/377 |
| 5,504,660 | 4/1996 | Heidorn | 362/27 |
| 5,515,244 | 5/1996 | Levins et al. | 362/32 |
| 5,544,006 | 8/1996 | Radloff et al. | 361/683 |
| 5,790,374 | 8/1998 | Wong | 362/32 |
| 5,835,646 | 11/1998 | Yoshimura et al. | 385/14 |

Primary Examiner—Hung N. Ngo

[57] ABSTRACT

The invention includes in a unitary piece a circuit board guide and a light conduit. This unitary piece includes a guide surface defining a longitudinal channel operable to receive an edge of a circuit board which is easily guided to a connector on a backplane or motherboard. Concurrently, the light conduit is operable to transmit light from a light source to a display area. Relevant information about the system is hence transmitted from the backplane to a viewing area accessible to a user. The unitary piece is typically made of optically transmissive plastics such as polycarbonates.

21 Claims, 5 Drawing Sheets

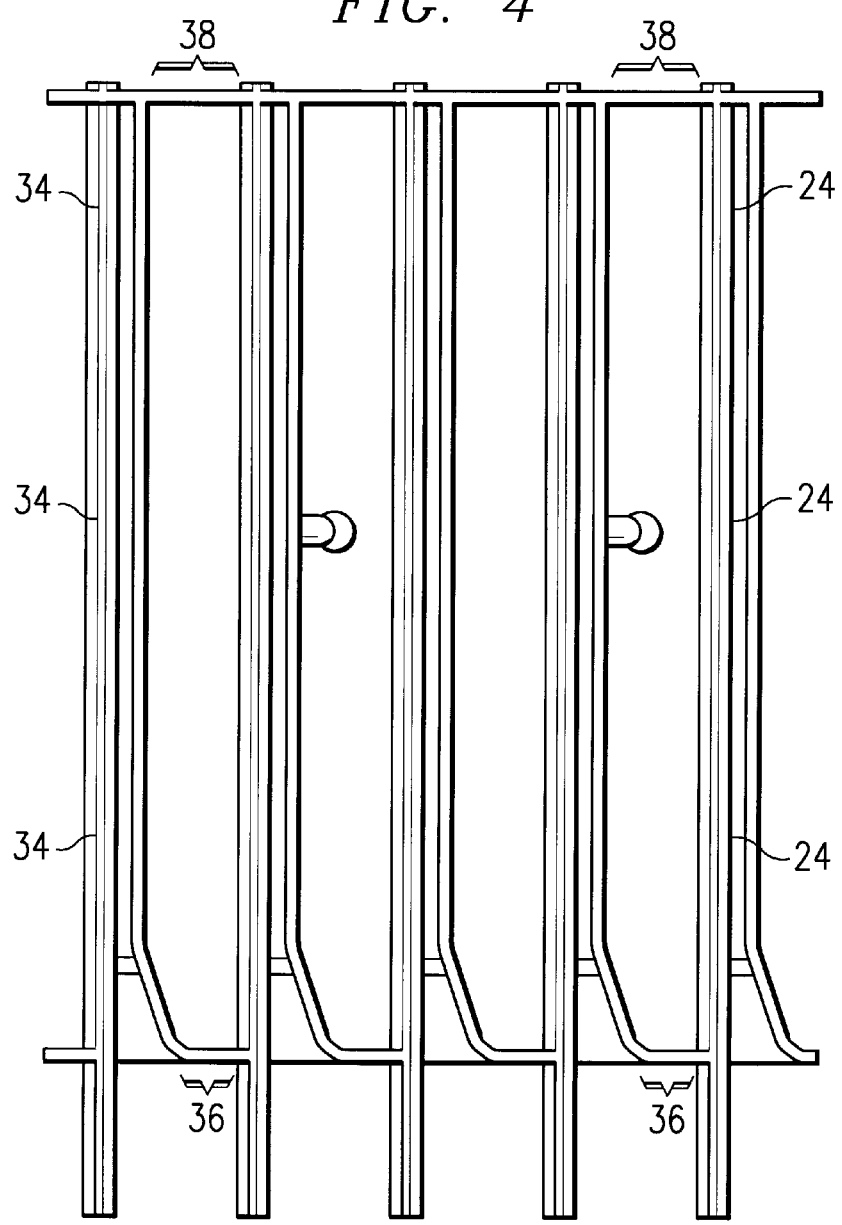

CIRCUIT BOARD GUIDE AND LIGHT CONDUIT

FIELD OF THE INVENTION

This invention relates to guides that are used to support or align circuit boards in electrical systems. The invention also relates to light conduits and other apparatus for transmitting light from a light source to a viewing area.

BACKGROUND

Electrical apparatus often include accessories which are provided on a plug-in circuit card and attached to the apparatus by inserting the card into a connector on a motherboard within the apparatus. For example, many computer designs have processor boards, memory boards, and the like which are connected to the computer by insertion into a connector on a motherboard. Connections between the card and motherboard are made by mating a connector on the card to a corresponding connector on the motherboard. As circuit complexity increases, the number and density of pins and sockets on the connectors increases. As the density increases, the accuracy with which the card must be positioned relative to the connector on the motherboard also increases. To provide this needed accuracy, various card guides are used in electrical and electronic systems. Card guides are typically positioned orthogonally relative to the connector on the motherboard. The circuit card slides in the card guide which provides the proper alignment during card insertion.

Electrical apparatus, such as computers for example, also conventionally include various light indicators to provide to a user a particular indication, e.g., that the computer or some aspect thereof is in an "on" condition. For example, to support On Line Replacement (OLR) of circuit cards, an indicator light lets the user know which card is ready to be removed. Indicators also indicate which slot is ready to receive a card to be added to the system. After the states of the card are stored and the card slot is powered down by the system, the indicator light changes color, or increases intensity, to indicate that the card be removed or added as required. It may occur, for certain design reasons, that the indicator light source is not aligned with an indicator window, or that the light source is not easily accessible or visible by the user. This may require opening or dismounting the apparatus, or using flash lights to see the light indicators in order to service the apparatus. Moreover access can be awkward and uncomfortable for the user. To resolve such problems, light pipes or conduits have been designed for transmitting the light from the light source to an indicator window formed in a computer housing. For example, one such design can be found in U.S. Pat. No. 5,515,244, entitled "Light-Transmitting Pipe," issued to James K. Levins, et al. on May 7, 1996, and assigned to Apple Computer, Inc.

To resolve both of the above-described problems in one system, separate devices have been used for light transmission and guidance of circuit boards. However, there are several problems associated with this solution. First, using two separate parts increases the overall weight of the system, and increases the internal crowding of the system. Moreover, such a separate solution often requires the overall volume of the system to be increased as well. These are real disadvantages in an era in which small size and light weight are increasingly important in the design of electronic systems. Second, using two parts instead of one directly increases the cost of the system with a higher manufacturing cost, and increased labor, procurement, storage and handling.

Accordingly, it is an object of the present invention to provide the function of a card guide to support or align circuit boards in an electrical or electronic system. It is a further object of the invention to provide the function of a light conduit in order to transmit light from a light source to a viewing area. It is still a further object of the invention to combine both of the above functions in a unitary part.

SUMMARY OF THE INVENTION

In an embodiment, the invention includes in a unitary piece a circuit board guide and a light conduit. This unitary piece includes at least one guide surface defining a longitudinal channel operable to receive an edge of a circuit board; and a light conduit operable to transmit light from a light source to a display area. The unitary piece may be made of optically transmissive plastics such as polycarbonates.

In another embodiment, the invention includes in a unitary piece a circuit board guide and light conduit. The unitary piece includes at least one guide surface defining a longitudinal channel operable to receive an edge of a circuit board, and a light conduit having a longitudinal outer surface. The longitudinal outer surface forms at least a portion of the guide surface. The light conduit has a source end and a display end. The source end of the conduit provides a planar polished surface oriented substantially perpendicularly to the axis of the conduit. The display end has usually a textured surface. The longitudinal outer surface of the light conduit is in part textured to form an intermediate display area such that light being conducted through the light conduit will be visible at the intermediate display area. In some embodiments, the intermediate display area of the light conduit forms a line or stripe oriented parallel to the axis of the light conduit. The material used to construct the circuit board guide and light conduit may be an optically transmissive plastic such as a polycarbonate plastic material.

In a further embodiment, the invention includes a circuit board guide and light conduit structure for use with multiple circuit boards. This structure includes a first circuit board guide and light conduit unit having at least a guide surface defining a longitudinal channel operable to receive an edge of a circuit board; and a light conduit having a longitudinal outer surface. The longitudinal outer surface of the light conduit forms a portion of the guide surface. The structure also includes a second circuit board guide and light conduit unit similar to the first one, and a connecting member coupled to the first and second circuit board guide and light conduit units so as to hold them in substantially fixed relationship with one another. The structure also includes a light conduit having a source end and a display end. In preferred embodiments, the source end has a planar polished surface oriented substantially perpendicularly to the axis of the light conduit, and the display end has a textured surface. In addition, in some embodiments a portion of the longitudinal outer surface of a light conduit is textured so as to form an intermediate display area such that light being conducted through the light conduit will be visible at the intermediate display area. This display area preferably forms a line or stripe oriented substantially parallel to the axis of the light conduit. The structure including at least two circuit board guide and light conduit units and a connecting member is formed as a unitary piece where in some embodiments the circuit board guide and light conduit units are substantially parallel to one another. These circuit board guide and light conduit units are made essentially with an optically transmissive plastic. While the light conduit itself is optically transmissive, the connecting members between adjacent circuit board guide and light conduit units is substantially not optically transmissive. This difference is optical and is achieved by texturing the connecting members. This reduces the communication of light from one conduit into an adjacent one.

In yet a further embodiment, the invention includes an electrical system, having different parts such as an enclosure with a light viewing aperture; a light source located inside the enclosure but disposed remotely from the light viewing aperture; and a circuit board guide and light conduit unit. The circuit board guide and light conduit unit includes at least one guide surface defining a longitudinal channel operable to receive an edge of a circuit board, and a light conduit having a source end and a display end and operable to transmit light from its source end to its display end. The abovementioned guide surface and light conduit are formed as a unitary piece. The source end of the light conduit is disposed near the light source, and the display end of the light conduit is disposed near the viewing aperture.

BRIEF DESCRIPTION OF THE DRAWINGS

FIG. 3 is a front orthogonal view of the unitary circuit board guide and light conduit structure of FIG. 1.

FIG. 4 is a top orthogonal view of the unitary circuit board guide and light conduit structure of FIG. 1.

DETAILED DESCRIPTION OF THE PREFERRED EMBODIMENTS

Figure 1:
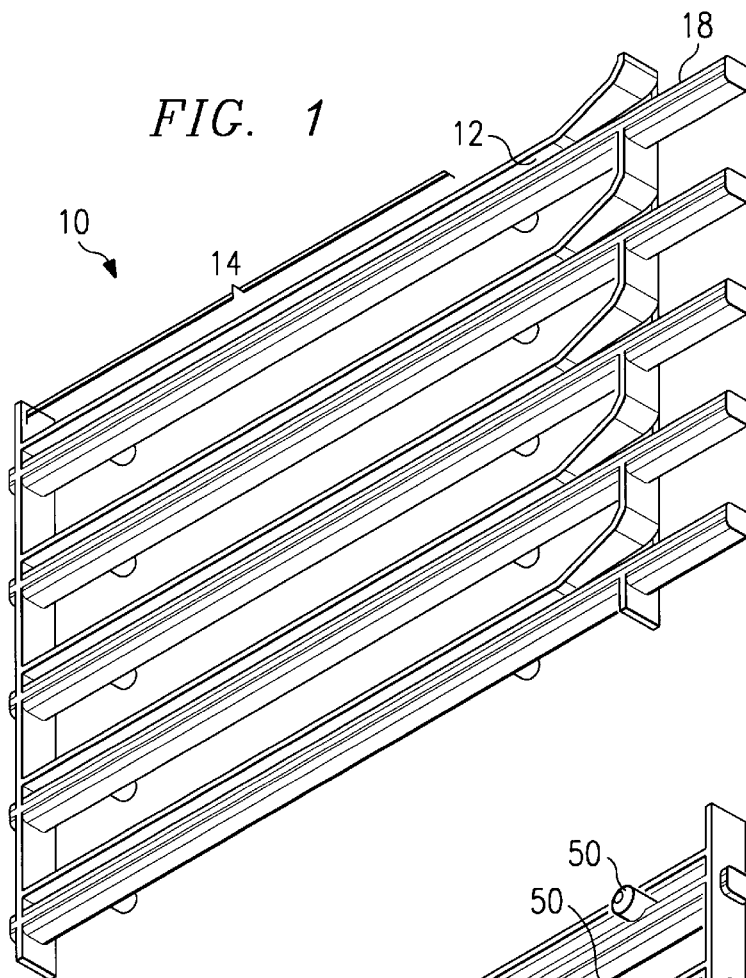
FIG. 1 is an oblique view of a unitary circuit board guide and light conduit structure according to a preferred embodiment of the invention.
Figure 2:
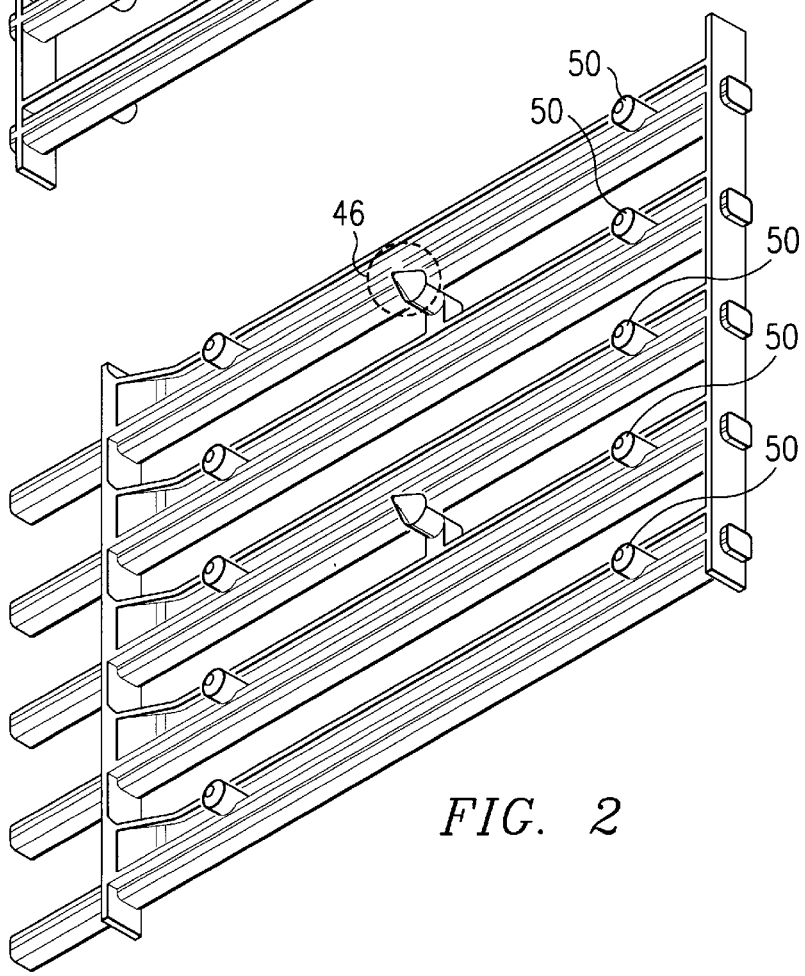
FIG. 2 is a reverse oblique view of the unitary circuit board guide and light conduit structure of FIG. 1.
Figure 5:
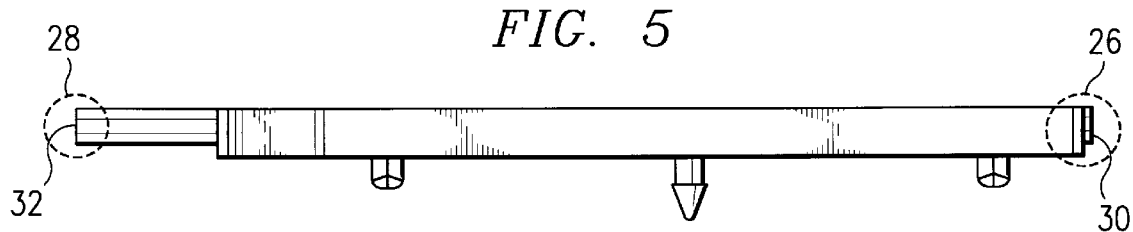
FIG. 5 is a right orthogonal view of the unitary circuit board guide and light conduit structure of FIG. 1.
Figure 6:
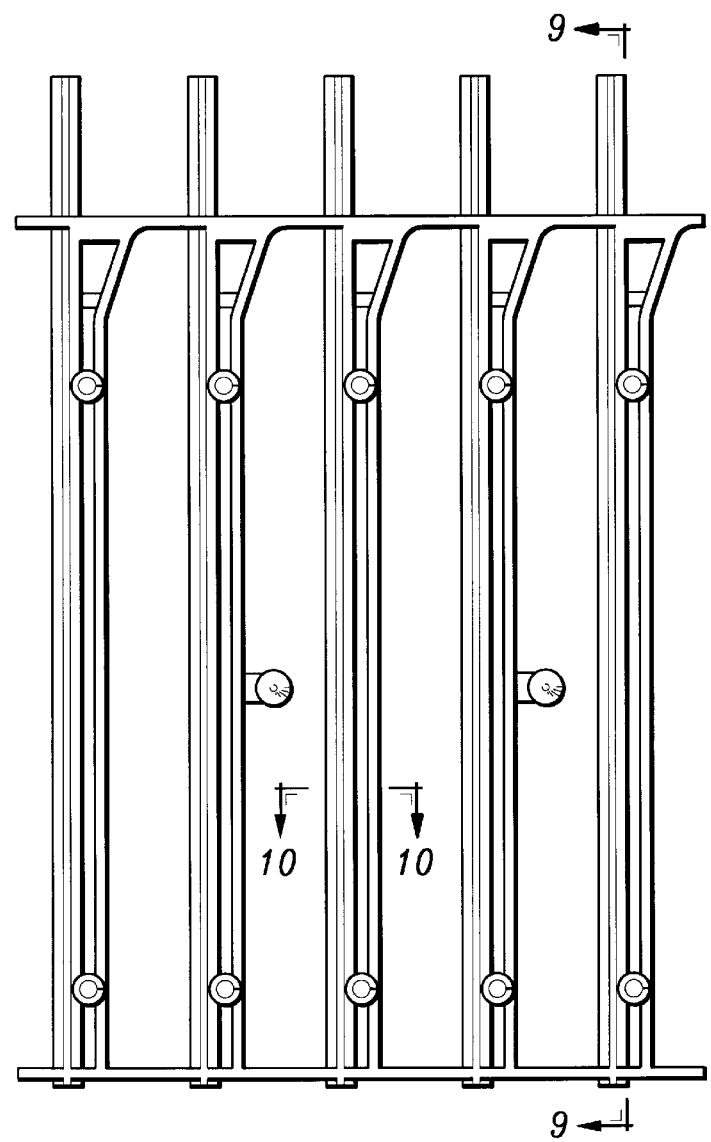
FIG. 6 is a bottom orthogonal view of the unitary circuit board guide and light conduit structure of FIG. 1.
Figure 7:
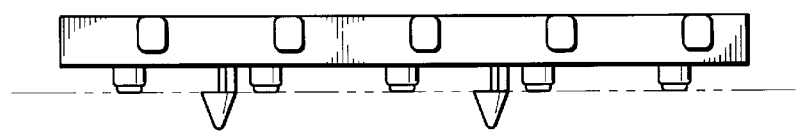
FIG. 7 is a back orthogonal view of the unitary circuit board guide and light conduit structure of FIG. 1.
Figure 8:
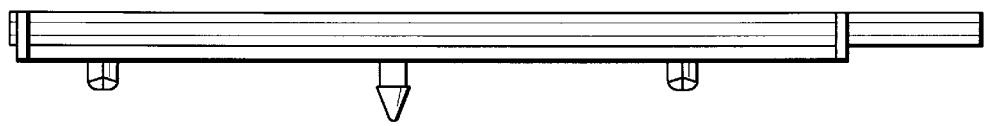
FIG. 8 is a left orthogonal view of the unitary circuit board guide and light conduit structure of FIG. 1.
Figure 9:
FIG. 9 is a cross-sectional view of the unitary circuit board guide and light conduit structure of FIG. 1 taken along line 9—9 of FIG. 6.
Figure 10:
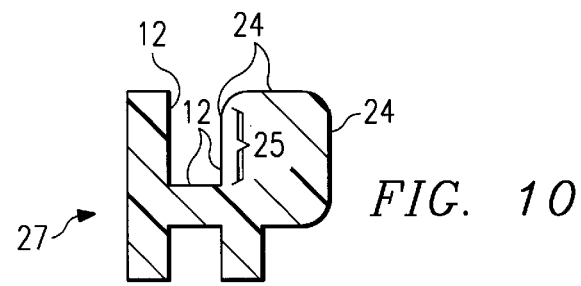
FIG. 10 is a cross-sectional view of the unitary circuit board guide and light conduit structure of FIG. 1 taken along line 10—10 of FIG. 6.
Figure 11:
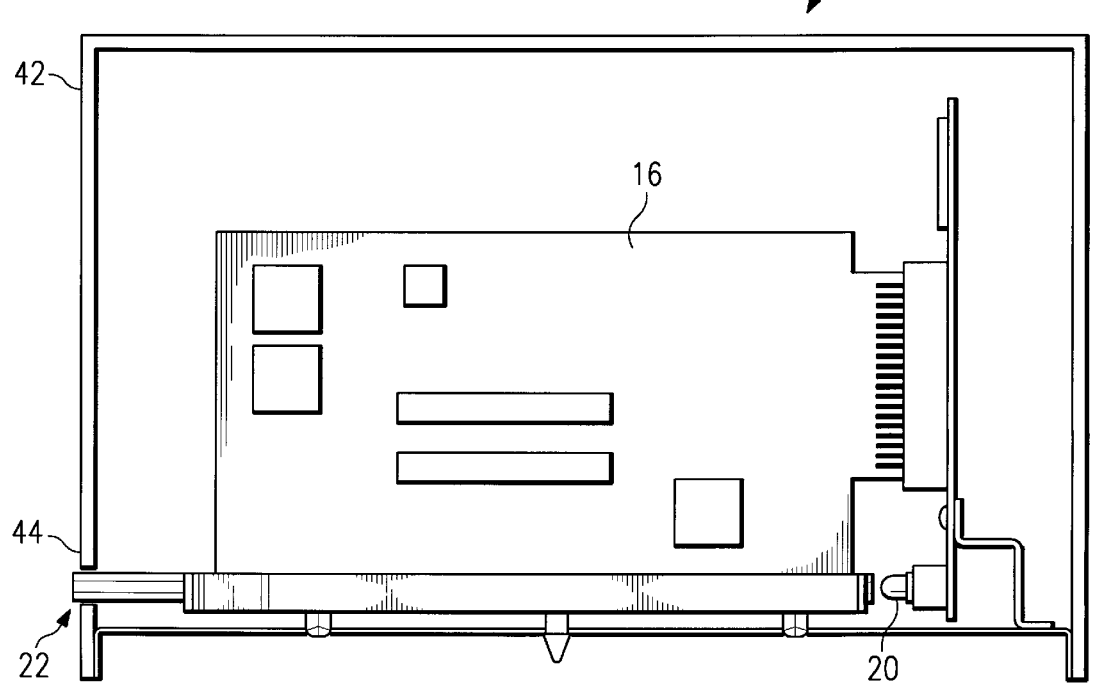
FIG. 11 is a cut-away view inside the enclosure of an electrical system having a unitary circuit board guide and light conduit structure installed therein according to a preferred embodiment of the invention.
Figure 12:
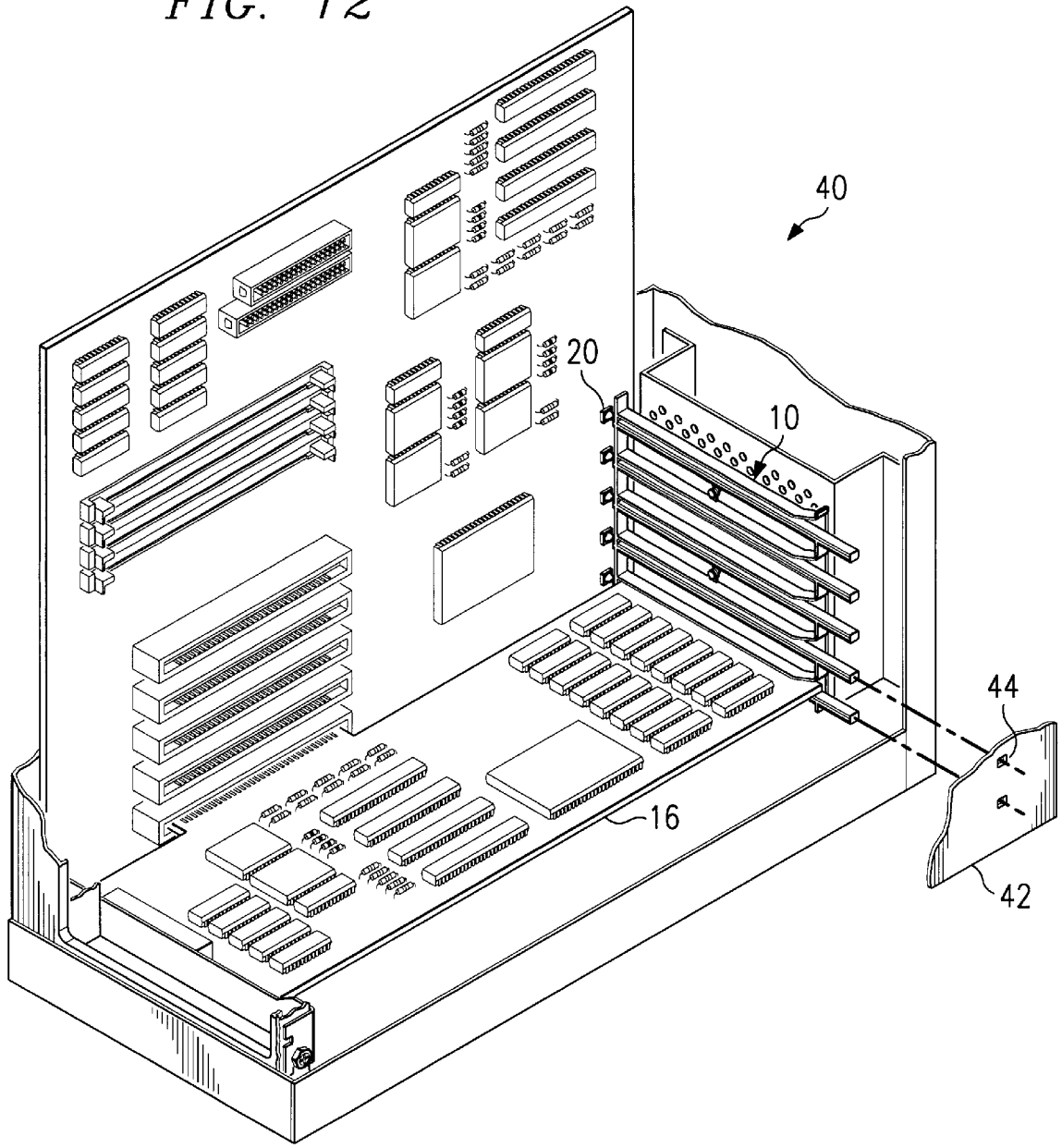
FIG. 12 is an oblique cut-away view inside the enclosure of another electrical system having a unitary circuit board guide and light conduit structure installed therein according to a preferred embodiment.

FIG. 1 is an oblique view of a unitary circuit board guide and light conduit structure 10 according to a preferred embodiment of the invention. Unitary circuit board guide and light conduit structure includes 10 a guide surface 12 defining a longitudinal channel 14 in which an edge of a circuit board 16 is introduced. By contact on the guide surface, the circuit board is advanced to proper position and alignment with a connector on a backplane or motherboard. The unitary circuit board guide and light conduit structure also includes a light conduit 18 designed to transmit light from a light source 20 to a display area 22. As indicated by the term "unitary," the guide surface and the light conduit are formed as a single piece. The unitary circuit board guide and light conduit is preferably made of an optically transmissive plastic such as a polycarbonate plastic material.

In another embodiment, the unitary circuit board guide and light conduit has a light conduit with a longitudinal outer surface 24. As shown at reference numeral 25, part of longitudinal surface 24 may actually form at least one of the guide surfaces 12. The light conduit has two extremities referred to as a source end 26 and a display end 28. The source end typically faces a light source on a system motherboard or backplane and has a planar polished surface 30 oriented substantially perpendicularly to the axis of the light conduit. The polished surface facing the light source at a perpendicular angle allows capturing a maximum amount of the light transmitted from the light source. Light is transmitted through the light conduit towards the display end, which typically faces a user. The display end has a textured surface 32 which allows better visibility of the light signals transmitted with a higher dispersion rate compared to a polished surface. Moreover, a part of the longitudinal outer surface of the light conduit may be textured, preferably in the form of a line or stripe parallel to the axis of the light conduit, to form an intermediate display area 34. The intermediate display area disperses a portion of the light being transmitted along the conduit and hence allows better illumination of the system.

In another embodiment, the invention includes a circuit board guide and light conduit structure for use with multiple circuit boards. This structure includes at least two circuit board guide and light conduit units 27, and connecting members 36, 38 attached to adjacent pairs of units in order to hold the units in fixed relationship with each other, typically in a substantially parallel position to each other. The circuit board guide and light conduit units 27 are similar to the abovementioned embodiments. Each circuit board guide and light conduit unit 27 includes a guide surface 12 defining a longitudinal channel 14 which receives and guides an edge of a circuit board 16. It also includes a light conduit 18 with a longitudinal outer surface 24 which forms a part of the guide surface 12. The extremities of the light conduit are referred to as source end 26 and display end 28. The source end 26 has typically a planer polished surface oriented substantially perpendicularly to the axis of the light conduit, and faces a light source. The display end 28 has a textured surface, and typically faces a user. Each of the circuit board guide and light conduit units 27 has also a textured portion 34 on the longitudinal outer surface of the light conduit. This textured portion 34 forms an intermediate display area, typically in the form of a line or stripe parallel to the axis of the light conduit. The light being transmitted trough the conduit will be visible at the intermediate display area. The entire circuit board guide and light conduit structure described in this paragraph is made in a unitary piece. The structure is typically a molded plastic piece made of an optically transmissive plastic material such as polycarbonate plastic. The connecting members between adjacent circuit board guide and light conduit units are however made substantially not optically transmissive. This is typically achieved not by the use of a different material, but by texturing the surface of the members and their attachment to the circuit board guide and light conduit units.

In yet another embodiment, the invention includes an electrical system having various parts. These parts include an enclosure 42 with a light viewing aperture 44. The enclosure serves as housing for the system, and has a certain number of light viewing apertures, each displaying a light source with relevant information to the system. The electrical system also includes a circuit board guide and light conduit unit having a guide surface and a light conduit formed in a unitary piece. The guide surface defines a longitudinal channel used to receive an edge of a circuit board. The light conduit has a source end facing the light source and a display end typically facing a user through the light viewing aperature. This allows the light viewing aperture to display a light source which is typically remotely disposed from it.

The attachment method of the unitary circuit board guide and light conduit to the enclosure will now be discussed briefly. In an embodiment, a latch 46 formed as part of a unitary circuit board guide and light conduit allows the structure to be mounted and fixed to an extruded metal sheet hole. The edge 48 of the latch applies pressure to the metal sheet from the side opposing the circuit board guide and light conduit structure. A number of bosses 50 fit into extruded holes in the metal sheet and allow the structure to be positioned on the metal sheet. The bosses are made directly into the structure and have a rounded shape which accommodates tolerances along the length of different pieces. This mechanism allows the circuit board guide and light conduit structure to be positioned on the metal sheet with acceptable accuracy.

While the invention has been described in detail in relation to a particular embodiment thereof, this description is intended to be illustrative only. It will be obvious to those skilled in the art that many modifications can be made to the described embodiment without departing from the spirit and scope of the invention, and that such modifications will remain within the scope of the following claims.

What is claimed is:

1. A circuit board guide and light conduit, comprising:
   at least one guide surface defining a longitudinal channel operable to receive an edge of a circuit board; and
   a light conduit operable to transmit light from a light source to a display area;
   wherein said at least one guide surface and said light conduit are formed as a unitary piece.

2. The circuit board guide and light conduit of claim 1, wherein said unitary piece comprises optically transmissive plastic.

3. The circuit board guide and light conduit of claim 2, wherein said unitary piece comprises polycarbonate.

4. A circuit board guide and light conduit, comprising:
   at least one guide surface defining a longitudinal channel operable to receive an edge of a circuit board; and
   a light conduit having a longitudinal outer surface;
   wherein said longitudinal outer surface forms at least a portion of said at least one guide surface.

5. The circuit board guide and light conduit of claim 4, wherein said light conduit and said at least one guide surface are a unitary piece.

6. The circuit board guide and light conduit of claim 4, wherein said light conduit has a source end and a display end, said source end having a planar polished surface oriented substantially perpendicularly to the axis of said light conduit.

7. The circuit board guide and light conduit of claim 6, wherein said display end has a textured surface.

8. The circuit board guide and light conduit of claim 4, wherein part of said longitudinal outer surface is textured to form an intermediate display area such that light being conducted through said light conduit will be visible at said intermediate display area.

9. The circuit board guide and light conduit of claim 8, wherein said intermediate display area forms a line oriented parallel to the axis of said light conduit.

10. The circuit board guide and light conduit of claim 5, wherein said unitary piece comprises optically transmissive plastic.

11. The circuit board guide and light conduit of claim 10, wherein said unitary piece comprises polycarbonate.

12. A circuit board guide and light conduit structure for use with multiple circuit boards, comprising:
    a first circuit board guide and light conduit unit comprising:
       at least a first guide surface defining a first longitudinal channel operable to receive an edge of a circuit board; and
       a first light conduit having a longitudinal outer surface, the longitudinal outer surface of said first light conduit forming at least a portion of said first guide surface;
    a second circuit board guide and light conduit unit comprising:
       at least a second guide surface defining a second longitudinal channel operable to receive an edge of a circuit board; and
       a second light conduit having a longitudinal outer surface, the longitudinal outer surface of said second light conduit forming at least a portion of said second guide surface; and
    a connecting member coupled to said first and second circuit board guide and light conduit units so as to hold them in substantially fixed relationship with one another.

13. The circuit board guide and light conduit structure of claim 12, wherein said first light conduit has a source end and a display end, said source end having a planar polished surface oriented substantially perpendicularly to the axis of said first light conduit, and said display end having a textured surface.

14. The circuit board guide and light conduit structure of claim 12, wherein a portion of the longitudinal outer surface of said first light conduit is textured so as to form an intermediate display area such that light being conducted through said first light conduit will be visible at said intermediate display area.

15. The circuit board guide and light conduit structure of claim 14, wherein said intermediate display area forms a line oriented substantially parallel to the axis of said first light conduit.

16. The circuit board guide and light conduit structure of claim 12, wherein said first and second circuit board guide and light conduit units and said connecting member are formed as a unitary piece.

17. The circuit board guide and light conduit structure of claim 16, wherein said unitary piece comprises optically transmissive plastic.

18. The circuit board guide and light conduit structure of claim 17, wherein said connecting member is substantially not optically transmissive.

19. The circuit board guide and light conduit structure of claim 17, wherein said unitary piece comprises polycarbonate.

20. The circuit board guide and light conduit structure of claim 12, wherein said first and second circuit board guide and light conduit units are substantially parallel to one another.

21. An electrical system, comprising:
    an enclosure having a light viewing aperture;
    a light source located inside said enclosure but disposed remotely from said light viewing aperture; and
    a circuit board guide and light conduit unit comprising:
       at least one guide surface defining a longitudinal channel operable to receive an edge of a circuit board; and
       a light conduit having a source end and a display end and operable to transmit light from said source end to said display end;
       wherein said at least one guide surface and said light conduit are formed as a unitary piece;
    said source end of said light conduit disposed near said light source, and said display end of said light conduit disposed near said viewing aperture.

* * * * *